United States Patent
Park et al.

(10) Patent No.: US 7,085,169 B2
(45) Date of Patent: Aug. 1, 2006

(54) FLASH MEMORY DEVICE CAPABLE OF REDUCING READ TIME

(75) Inventors: Dong-Ho Park, Gyeonggi-do (KR); Myong-Jae Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/813,909

(22) Filed: Mar. 26, 2004

(65) Prior Publication Data

US 2005/0052922 A1   Mar. 10, 2005

(30) Foreign Application Priority Data

Mar. 26, 2003   (KR) ..................... 10-2003-0018963

(51) Int. Cl.
   *G11C 11/34*   (2006.01)
(52) U.S. Cl. ............................... 365/185.25; 365/233.5
(58) Field of Classification Search ........... 365/185.25, 365/233.5
   See application file for complete search history.

(56) References Cited

U.S. PATENT DOCUMENTS

| | | | |
|---|---|---|---|
| 5,642,324 A * | 6/1997 | Ghosh et al. | 365/230.03 |
| 5,798,976 A * | 8/1998 | Arimoto | 365/222 |
| 6,046,940 A * | 4/2000 | Takeuchi et al. | 365/185.17 |
| 6,097,638 A * | 8/2000 | Himeno et al. | 365/185.25 |
| 6,147,910 A * | 11/2000 | Hsu et al. | 365/185.25 |
| 6,288,953 B1 | 9/2001 | Kwak | |
| 6,507,900 B1 * | 1/2003 | Okajima | 711/169 |
| 6,862,247 B1 * | 3/2005 | Yamazaki | 365/233 |

* cited by examiner

*Primary Examiner*—Michael Tran
(74) *Attorney, Agent, or Firm*—Marger Johnson & McCollom, P.C.

(57) ABSTRACT

A flash memory device is disclosed that includes a control circuit for generating a count-up pulse signal notifying a generation of an address required for a burst read operation. An address generator circuit generates an address in response to the count-up pulse signal, and a discharge circuit discharges global bit lines in response to the count-up pulse signal. According to this control scheme, the global bit lines may be discharged before the local and global bit lines are selected.

21 Claims, 7 Drawing Sheets

FLASH MEMORY DEVICE CAPABLE OF REDUCING READ TIME

This application claims priority from Korean Patent Application No. 2003-18963, filed on Mar. 26, 2003, the contents of which is herein incorporated by reference in its entirety.

FIELD OF THE INVENTION

This disclosure generally relates to semiconductor devices and, more specifically, to flash memory devices.

BACKGROUND OF THE INVENTION

Flash memory devices have achieved a commercial success in an electronic industry because they are able to store data for a relatively long time even without a power supply. In addition, the flash memory devices can be erased and programmed by end users after the memory devices are installed in electronic apparatuses. These functionalities are useful in the field of electronic apparatuses such as cellular telephones, personal digital assistants (PDAs) and computer BIOS storages and in the other field where a program function is required and where a power is suddenly interrupted. The flash memory devices have an array of memory transistors or cells that are similar to what are used in the other type of memory devices. The flash memory devices may achieve a non-volatility by adding a floating gate between a control gate of each memory transistor and a substrate region. Like other memory devices, the memory transistors are arranged in rows and columns to form an array of transistors. As well known in the field of memory technologies, control gates of memory cells in each row are connected to a plurality of word lines, such that the memory cells in each row can be accessed by selecting corresponding word lines. Similarly, drain regions of the cells in each column are connected to a plurality of bit lines, such that the cells in each column can be accessed by selecting corresponding bit lines. Source regions of memory cells are connected to a common source line. In some flash memory devices, a memory cell array is divided into sectors, each of which includes an individual transistor array, to provide a flexibility for a program or erase operation.

The data stored in each memory cell indicates a binary data value "1" or "0" as widely known in the art. To perform a program, read or erase operation at a specific cell in the array, various voltages are supplied to the control gate, drain region and source region in the memory cell. Respective memory cells at intersections of bit lines and word lines can be selected to be programmed or to be read by applying the various voltages to the bit line, the word line and the common source line.

In order to program a memory cell, voltages of the control gate and the drain region of the memory cell are raised up to predetermined program voltages (e.g., 10 volts and 5 to 6 volts) and the source thereof is grounded. The voltages of the control gate and the drain region drive generation of hot electrons to form negative charges at a floating gate. The hot electrons are captured in a floating gate. This electron transmission mechanism is usually referred to as "channel hot electron (CHE)" injection. When program voltages are discharged, the negative charge of the floating gate is maintained, thereby resulting in an increase of a threshold voltage. During a read operation, the threshold voltage is used for determining whether the memory is programmed or not.

The memory cells are read by applying predetermined voltages (e.g., 4.5 volts and 1 volt) to the control gate and the drain region and applying a ground voltage to the source. A bit line current or voltage is sensed by a sense amplifier. If a cell is programmed, its threshold voltage is relatively high and the bit line current is "0" or relatively low. Meanwhile, if a cell is erased, its threshold voltage is relatively low and the bit line current is relatively high.

Differently from the programming, the flash memory device is erased by a bulk unit and every memory cell in a sector is erased at the same time. One way to erase entirely a memory sector is that predetermined voltages (e.g., −10 volts and 6 volts) are applied to every word line and a bulk region in the sector, and the drain regions and a common source line are left floating. This makes electrons tunnel from the floating gate to the source region by means of the Fowler-Nordheim tunneling, such that the negative charge is removed from a floating gate of respective memory cells in the memory sector.

Generally, the reading operation is carried out in a manner of a random access and users assign a specific address to a memory array of in a memory device to read. However, a burst read mode may be provided for the memory device. In the burst read mode, data of an entire memory array or data of memory cells connected to any word line is sequentially read out, and then the read-out data is output to the user during succeeding clock cycles. In this mode, the users need not provide addresses to the memory device because the addresses are successively generated in the memory device. Generally, the function is useful to output entire data in a memory device or data of memory cells in any row.

SUMMARY OF THE INVENTION

Embodiments of the present invention provide a non-volatile semiconductor memory device capable of reducing a time needed to read data in a burst read mode.

In some embodiments of the present invention, a semiconductor memory device is provided that includes a number of first bit lines and a number of second bit lines. A signal generator circuit generates a flag signal indicating a burst read operation, and an address generator circuit generates an address in response to the flag signal. A column selection circuit selects a part of the first bit lines in response to the addresses, and the first bit lines thus selected are respectively connected to the second bit lines. A discharge circuit discharges voltages of the second bit lines in response to the flag signal.

In this embodiment, the signal generator circuit generates the flag signal indicating a next burst read operation after an initial address is received. The signal generator circuit generates the flag signal synchronized to a clock signal. Preferably, the discharge circuit includes a discharge signal generator which generates a discharge signal in response to the flag signal, and a number of NMOS transistors which are respectively connected between the second bit lines and a ground voltage and are controlled by the discharge signal. In particular, the second bit lines are discharged before the selecting operation of the column selection circuit.

DETAILED DESCRIPTION OF THE PREFERRED EMBODIMENT

The present invention will be described more fully hereinafter with reference to the accompanying drawings, in which exemplary embodiments of the invention are shown.

A flash memory device according to embodiments of the present invention has a burst read mode, which is employed to improve a read speed. In the burst read mode, after an initial address is received and a time elapses, all data in a sector or data of memory cells in a word line are successively outputted to the outside in synchronization with a clock signal. Embodiments of the present invention are able to reduce a discharge time of global bit lines at a burst read operation where a higher read speed (or a shorter read time) is required, which will be more fully described hereinafter.

Figure 1:
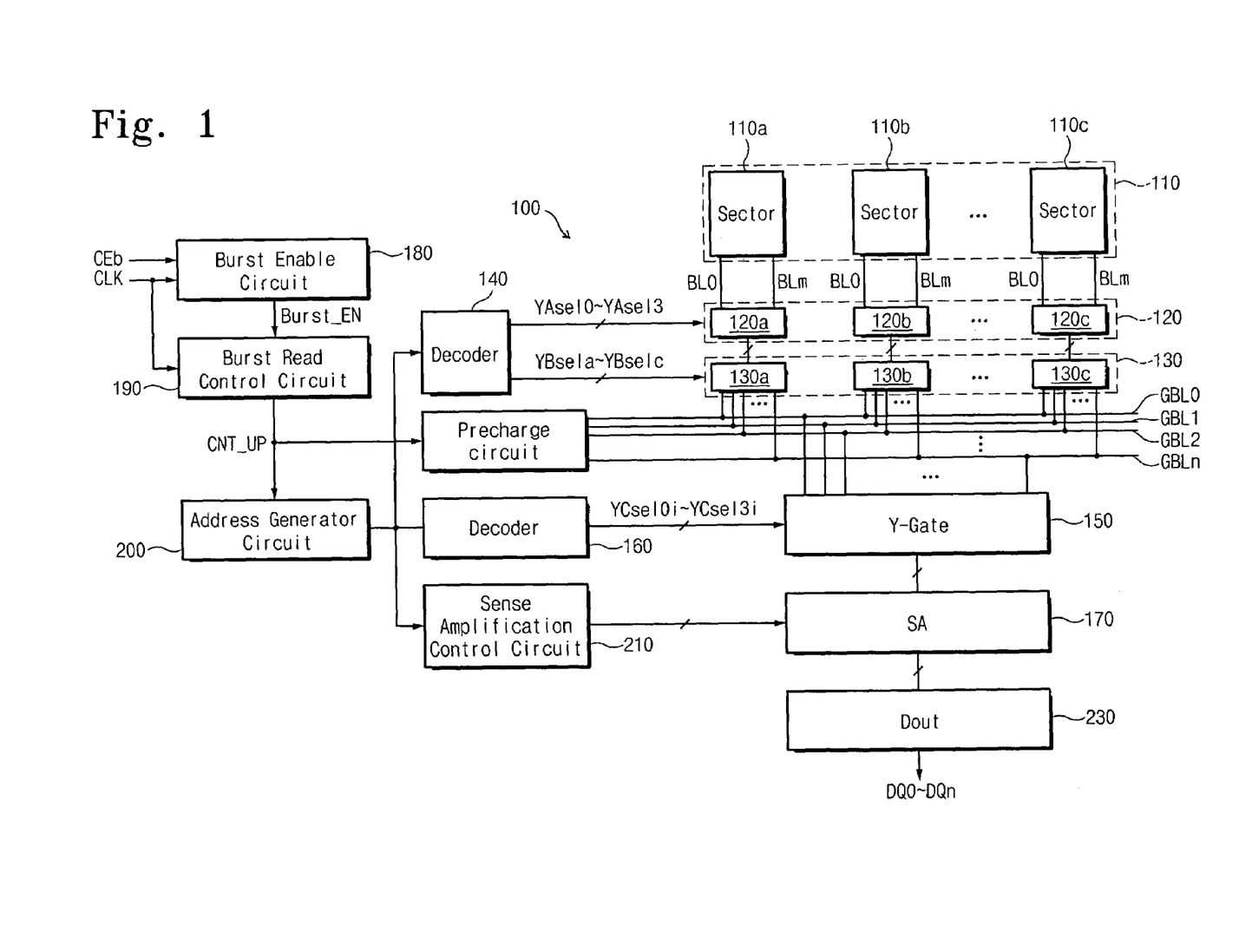
FIG. 1 is block diagram illustrating a flash memory device according to embodiments of the present invention.

FIG. 1 is a block diagram illustrating a flash memory device according to embodiments of the present invention.

Referring to FIG. 1, a flash memory device 100 includes a memory cell array 110 for storing data, which is divided into a number of sectors (or memory sectors) 110a–110c each of which has memory cells arranged in rows and columns. The sectors 110a–110c may be erased separately. A first column gate block 120 includes a number of first column gate circuits 120a–120c each corresponding to the sectors 110a–110c. Each of the first column gate circuits 120a–120c selects a part of columns of a corresponding sector in response to selection signals YAsel0–YAsel3 from a decoder circuit 140. For example, the first column gate circuit 120a selects a part of local bit lines BL0–BLm (m is an integer larger than 1) of the sector 110a in response to the selection signals YAsel0–YAsel3 from the decoder circuit 140. The first column gate circuit 120b selects a part of local bit lines BL0–BLm of the sector 110b in response to the selection signals YAsel0–YAsel3 from the decoder circuit 140. The first column gate circuit 120c selects a part of local bit lines BL0–BLm of the sector 110c in response to the selection signals YAsel0–YAsel3 from the decoder circuit 140.

Still referring to FIG. 1, a sector select block 130 selects one of the sectors 110a–110c in response to sector selection signals YBsela–YBselc. The sector select block 130 includes sector select circuits 130a–130c corresponding respectively to the sectors 110a–110c. Each of the sector select circuits 130a–130c connect local bit lines selected by the corresponding first column gate circuit to corresponding global bit lines GBL0–GBLn (n is an integer larger than 1), respectively. For example, the sector select circuit 130a operates in response to the sector selection signal YBsela, and connects the local bit lines of sector 110a selected by the first column gate circuit 120a to the global bit lines GBL0–GBLn, respectively. The sector select circuit 130b operates in response to the sector selection signal YBselb, and connects the local bit lines of the sector 110b selected by the first column gate circuit 120b to the global bit lines GBL0–GBLn, respectively. The sector select circuit 130c operates in response to the sector selection signal YAselc, and connects the local bit lines of the sector 110c selected by the first column gate circuit 120c to the global bit lines GBL0–GBLn, respectively.

During a normal read operation, one of the sectors 110a–110c is selected by the sector select block 130 and a part of local bit lines of the selected sector is selected by the first column gate block 120. Therefore, the part of the local bit lines of the selected sectors are connected to the global bit lines GBL0–GBLn through the first column gate block 120 and the sector select block 130, respectively.

A second column gate block 150 (in this figure, marked by "Y-Gate") selects the global bit lines GBL0–GBLn in response to selection signals YCsel0i–YCsel3i ("i" represents a burst length) from a decoder circuit 160. The selected global bit lines GBL0–GBLn are connected to a sense amplification block 170 (in this figure, marked by "SA"). The sense amplification block 170 includes sense amplifier groups corresponding to a burst length. The number of sense amplifiers in each group is determined according to a bit organization of the flash memory device 100. For example, if the burst length is four and the flash memory device 100 has a bit organization of ×16, the sense amplification block 170 includes four sense amplifier groups and the number of the amplifiers in each group is 16.

Figure 4:
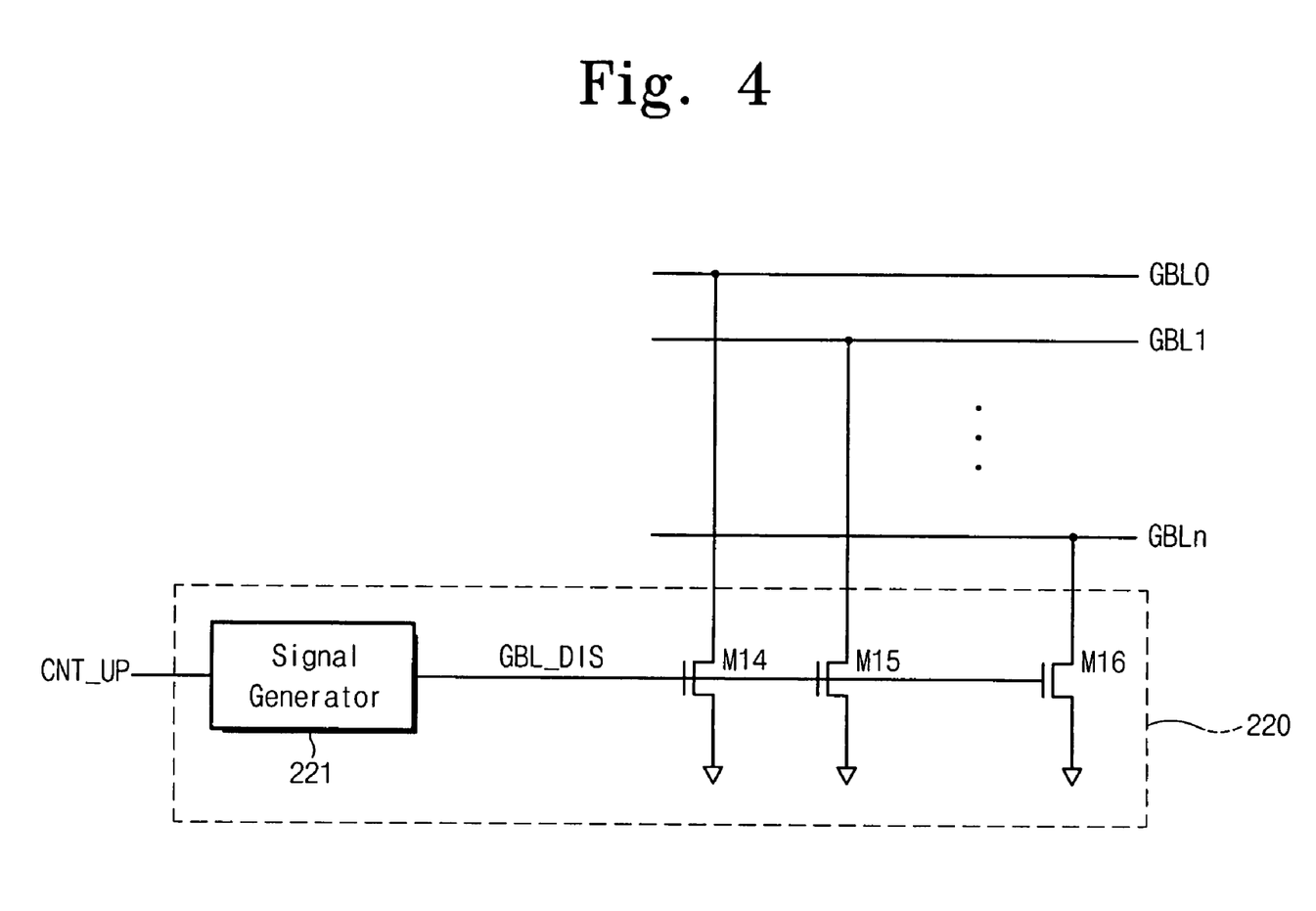
FIG. 4 is a circuit diagram illustrating an example discharge circuit of FIG. 1 according to an exemplary embodiment of the present invention.

Referring now to FIG. 1, the flash memory device 100 further includes a burst enable circuit 180, a burst read control circuit 190, an address generator circuit 200, a sense amplification control circuit 210, and a discharge circuit 220 (FIG. 4).

The burst enable circuit 180 operates in synchronization with a clock signal CLK and generates a burst enable signal Burst_EN in response to a chip enable signal CEb. For instance, the burst enable circuit 180 activates the burst enable signal Burst_EN to a high level when the chip enable signal CEb has a high-to-low transition and the clock signal CLK has a low-to-high transition. The burst read control circuit 190 operates in synchronization with the clock signal CLK, and periodically generates a count-up pulse signal CNT_UP after the burst enable signal Burst_EN is activated and a time elapses. In this case, the time is when data of a burst length is sufficiently read out by the sense amplification block 170 according to an input of an initial address. The time corresponds to, for example, at least four periods of the clock signal CLK. The address generator circuit 200 provides a next address of the initial address in response to the count-up pulse signal CNT_UP. The above decoder circuits 140 and 160 decode addresses from the address generator circuit 200 to generate selection signals.

In some embodiments, the address generator circuit 200 may include a counter as well known to those skilled in the art.

The sense amplification control circuit 210 detects a transition of an address outputted from the address generator circuit 200, and generates control signals in a given timing pattern. Sense amplifiers in the sense amplification block 170 may operate in response to the control signals outputted from the sense amplification control circuit 210. The discharge circuit 220 (FIG. 4) is connected to the global bit lines GBL0–GBLn and discharges the voltages of the global bit lines GBL0–GBLn to a reference voltage (e.g., a ground voltage) in response to the count-up pulse signal CNT_UP from the burst read control circuit 190.

In some embodiments, the sense amplification control circuit 210 may include an address transition detector (ATD). An exemplary address transition detector circuit is disclosed in U.S. Pat. No. 6,288,953 entitled "SEMICONDUCTOR MEMORY DEVICE HAVING SENSE AMPLIFIER CONTROL CIRCUIT RESPONDING TO AN ADDRESS TRANSITION DETECTION CIRCUIT".

As described above, when a count-up pulse signal CNT_UP is generated, a discharge circuit 220 and an address generator circuit 200 operate first, and then decoder circuits 140 and 160 decode addresses generated from the address generator circuit 200. That is, the voltages of the global bit lines GBL0-GBLn are discharged when the count-up pulse signal CNT_UP is generated.

In FIG. 1, the first column gate block 120, the sector selection block 130 and the decoder circuit 140 constitute a column selector circuit which selects a part of the local bit lines of a selected sector in response to the addresses from the address generator circuit 200 connecting the selected local bit lines to the global bit lines. The second column gate block 150 and the decoder circuit 160 constitute a column selector circuit which selects a part of the global bit lines in response to the addresses from the address generator circuit 200 connecting the selected global bit lines to the sense amplification block 170. The burst enable circuit 180 and the burst read control circuit 190 constitute a signal generator circuit which generates a flag signal CNT_UP indicating a burst read operation in response to the clock signal CLK and the chip enable signal CEb.

Figure 2:
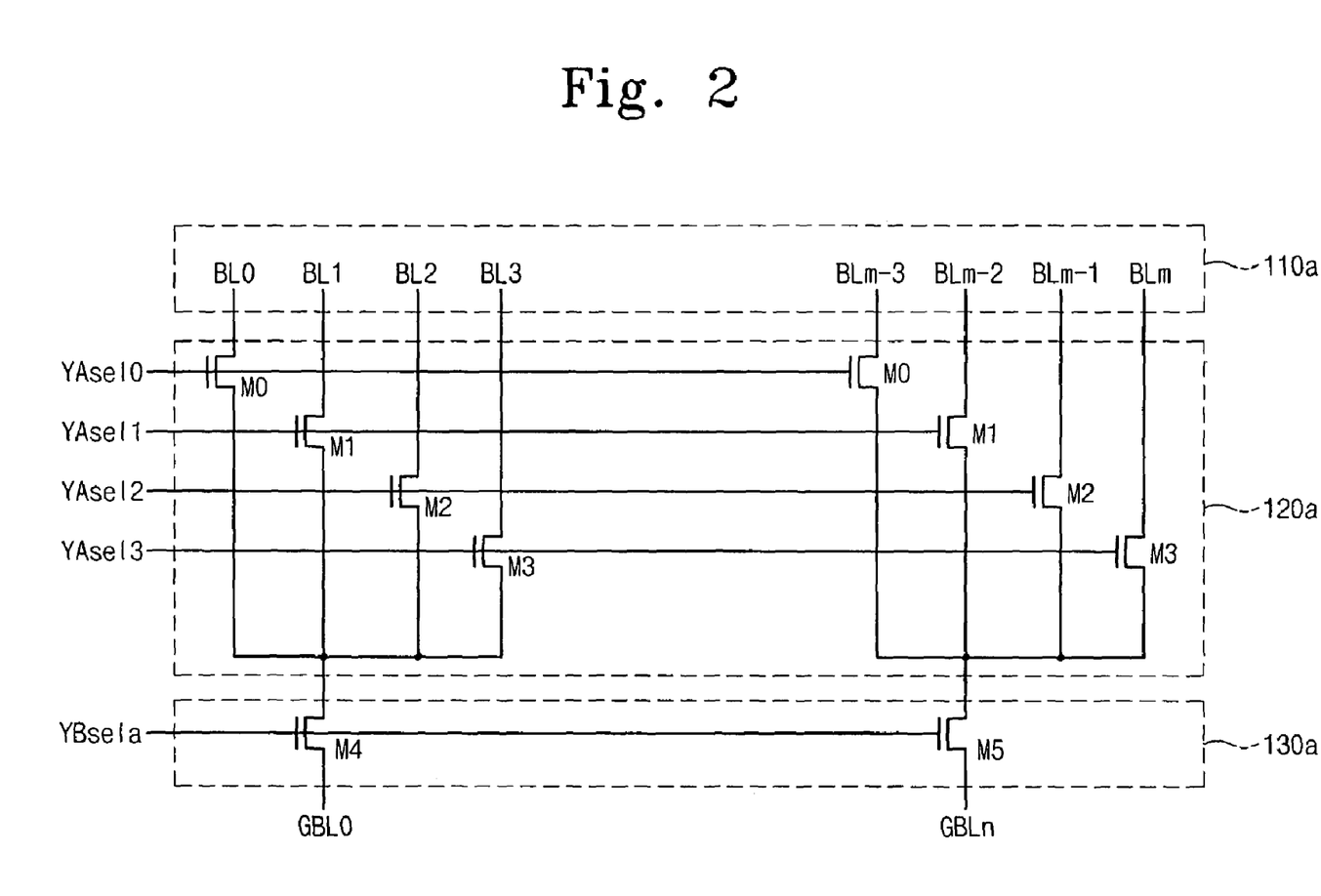
FIG. 2 is a circuit diagram illustrating an example first column gate circuit 120a and an example sector selection circuit 130a corresponding to the sector 110a of FIG. 1.

FIG. 2 is a circuit diagram illustrating an example first column gate circuit 120a and a sector selection circuit 130a that may correspond to the sector 110a shown in FIG. 1.

Referring to FIG. 2, the first column gate circuit 120a selects a part of local bit lines BL0–BLm of a sector 110a in response to selection signals YAsel0–YAsel3. The local bit lines BL0–BLm are divided into a number of groups, each of which includes four local bit lines. The first column gate circuit 120a includes NMOS transistors M0–M3 connected respectively to the local bit lines of each group. In each group, the first NMOS transistors M0 are controlled by the selection signal YAsel0 in common, the second NMOS transistors M1 are controlled by the selection signal YAsel1 in common, the third NMOS transistors M2 are controlled by the selection signal YAsel2 in common, and the fourth NMOS transistors M3 are controlled by the selection signal YAsel3 in common. The local bit lines selected by the first column selection circuit 120a are connected to the corresponding global bit lines GBL0–GBLn through the sector selection circuit 130a, respectively. The sector selection circuit 130a includes NMOS transistors M4–M5 connected respectively to the global bit lines GBL0–GBLn, and the NMOS transistors M4–M5 are controlled by the selection signal YBsela for selecting the sector 110a in common.

When the selection signals YAsel0 and YBsela are activated, first local bit lines BL0, BL4, ... ,BLm–3 of the groups are connected to the corresponding global bit lines GBL0–GBLn through the corresponding NMOS transistors M4 and M5 of the sector selection circuit 130a, respectively.

Figure 3:
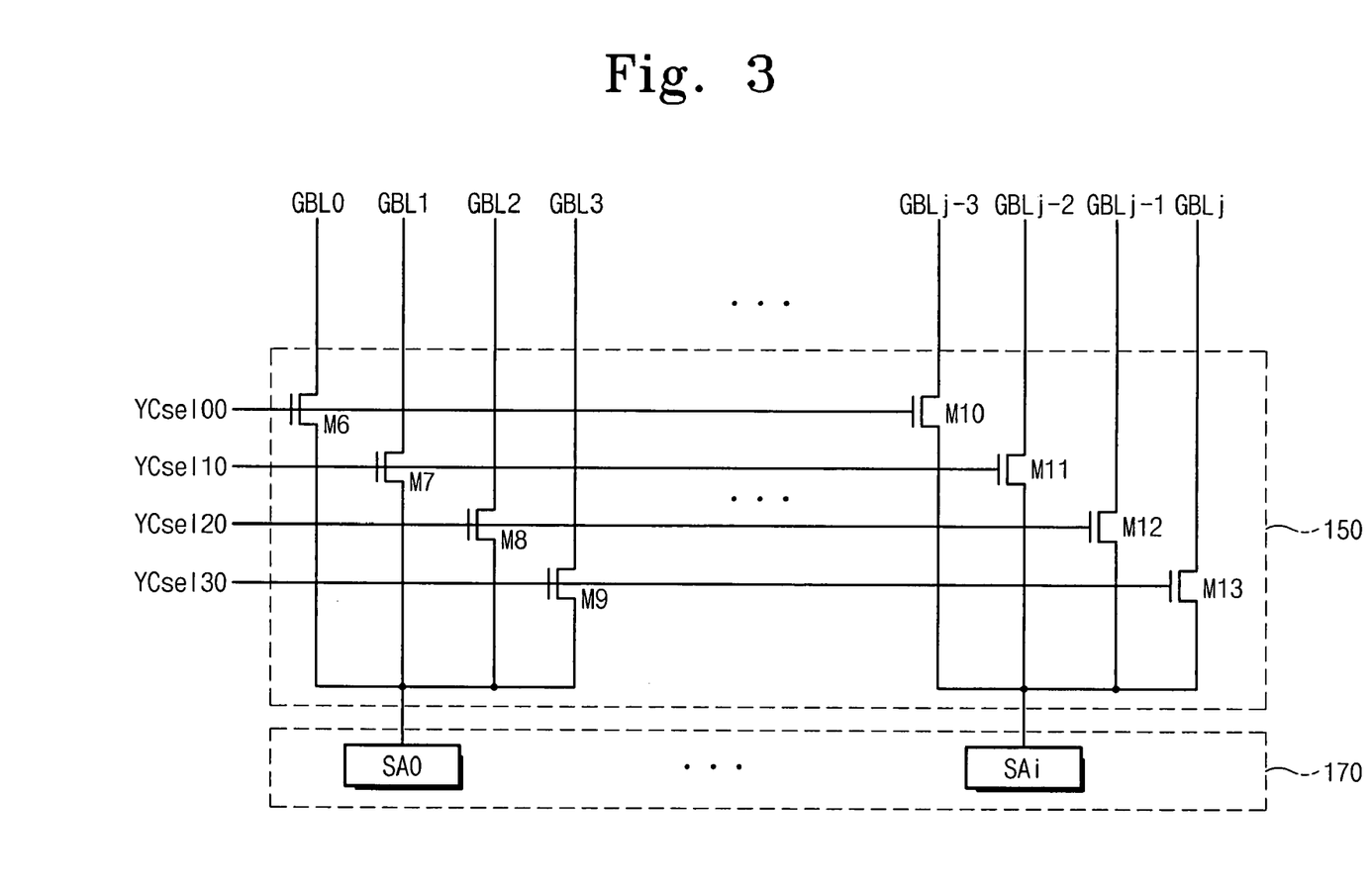
FIG. 3 is a circuit diagram illustrating an example second column gate block 150 and an example portion of a sense amplification block 170.

FIG. 3 is a circuit diagram illustrating a portion of the second column gate block 150 and the sense amplification block 170 illustrated in FIG. 1.

FIG. 3 illustrates only a group of sense amplifiers SA0–Sai. As described above, the number of the sense amplifiers SA0–SAi of each group is determined according to a bit organization of the flash memory device 100. The number of sense amplifier groups is determined according to a burst length. The second column gate block 150 operates in response to the selection signals YCsel00–YCsel30 and selectively connects a part of the global bit lines GBL0–GBLn to the sense amplifiers SA0–SAi of one group. The second column gate block 150 includes a number of NMOS transistors M6–M13, which are connected as illustrated in the drawings.

FIG. 4 is a circuit diagram illustrating a discharge circuit of FIG. 1 according to an exemplary embodiment of the present invention.

Referring to FIG. 4, the discharge circuit 220 includes a number of NMOS transistors M14–M16 corresponding respectively to the global bit lines GBL0–GBLn and a signal generator 221. The signal generator 221 generates a discharge signal GBL_DIS in response to a count-up pulse signal CNT_UP. The NMOS transistors M14–M16 operate in response to the discharge signal GBL_DIS, and are connected in parallel between corresponding global bit lines and the ground voltage. When the count-up pulse signal CNT_UP is activated to a high level, the voltages of the global bit lines GBL0–GBLn are discharged.

Figure 5:
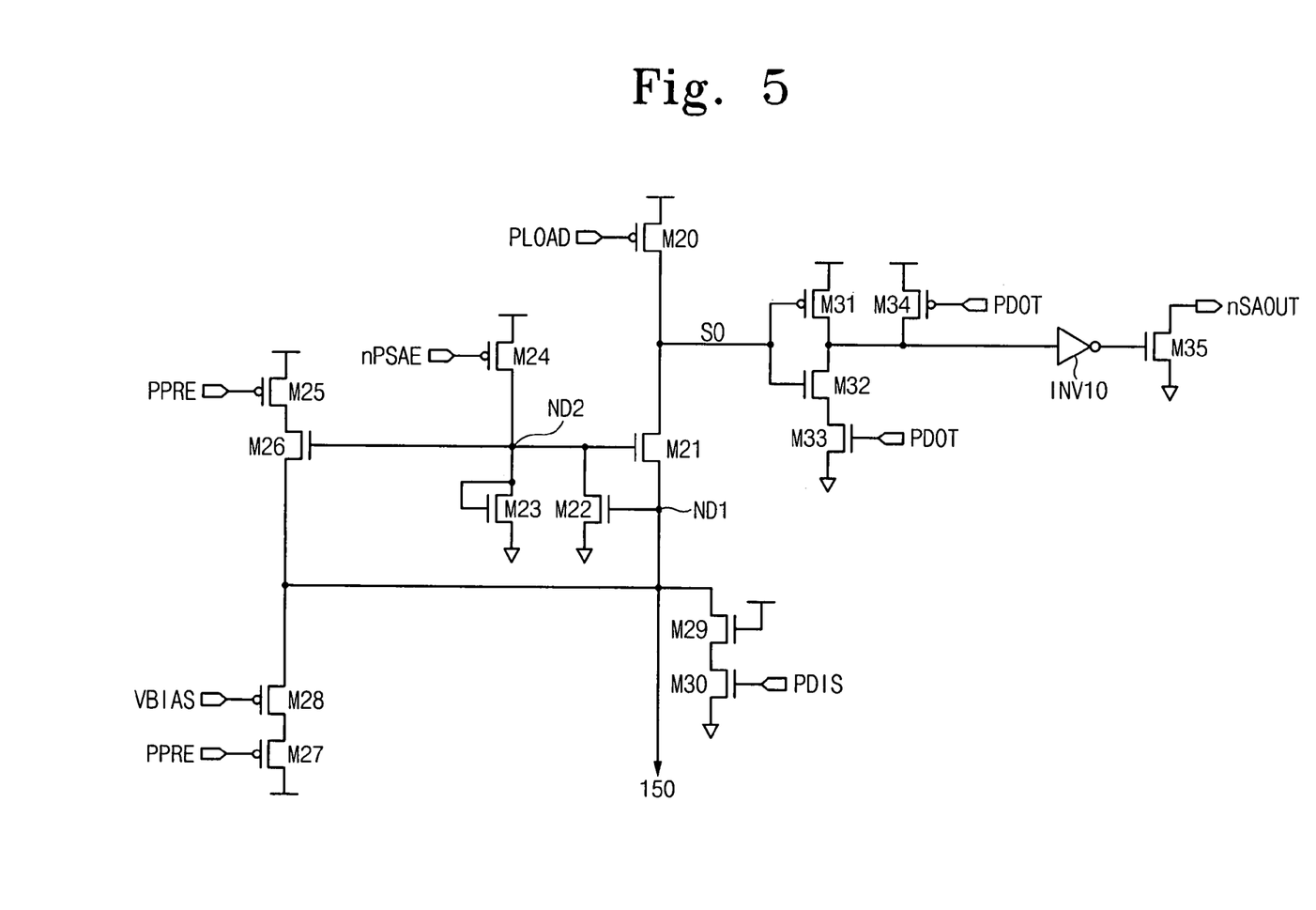
FIG. 5 is a circuit diagram illustrating a sense amplifier according to an exemplary embodiment of the present invention.

FIG. 5 is a circuit diagram illustrating an example sense amplifier according to embodiments of the present invention. Referring to FIG. 5, the sense amplifier SA0 includes a number of PMOS transistors M20, M24, M25, M27, M28, M31, and M34, a number of NMOS transistors M21, M22, M23, M26, M29, M30, M32 and M35, and an inverter INV10.

The PMOS transistor M20 is connected between a power voltage and a sense node SO, and turned on/off according to a control signal PLOAD. The NMOS transistor M21 is connected between the sense node S0 and a node ND1, and controlled by a voltage of a node ND2. The PMOS transistor M24 is connected between the power voltage and the node ND2, and turned on/off according to a control signal nPSAE. The NMOS transistor M22 whose gate is connected to the node ND1 is connected between the node ND2 and a ground voltage. The node ND1 may be connected to a selected global bit line through the second column gate block 150. The NMOS transistor M23 is diode-connected between the node ND2 and the ground voltage. The PMOS transistor M25 and the NMOS transistor M26 are connected in series between the power voltage and a node ND1, and the PMOS transistors M27 and M28 are connected in series between the power voltage and the node ND1. The PMOS transistors M25 and M27 are tuned on/off according to a control signal PPRE, the NMOS transistor M26 is controlled according to a voltage of node ND2, and the PMOS transistor M28 is controlled by a bias voltage VBIAS.

Still referring to FIG. 5, NMOS transistors M29 and M30 are connected in series between the node ND1 and the ground voltage. A gate of the NMOS transistor M29 is connected to the power voltage, and a gate of the NMOS transistor M30 is connected to receive a control signal PDIS. The transistors M31, M32 and M33 are connected in series between the power voltage and the ground voltage. The PMOS and NMOS transistors M31 and M32 are controlled by a voltage of the sense node SO and the NMOS transistor M33 is connected to receive a control signal PDOT. The inverter INV10 is connected to a common drain node of the PMOS and NMOS transistors M31 and M32, and the NMOS transistor M35 is controlled by an output of the inverter INV10. The PMOS transistor M34 is connected between the power voltage and the common drain node of the PMOS and NMOS transistors M31 and M32, and connected by a control signal PDOT.

When a read operation is carried out, the control signal nPSAE transitions from a high level to a low level, and the NMOS transistor M21 is turned on. In this case, the control signal PLOAD is fixed at a low level. Next, as the control signal PDIS transitions from a low level to a high level, the voltages of the nodes ND1 and SO are discharged to a ground voltage through the NMOS transistors M29 and M30. As the control signal PDIS is inactivated to a low level, the voltage of the node ND1 increases according to a current from the sense node SO through the NMOS transistor M21. As the voltage of the node ND1 increases, the NMOS transistor M22 is turned on. At the same time, a control signal PPRE becomes activated, a current is provided to the node ND1 through a bias circuit which is constituted of the MOS transistors M25–M28. These operations set the sense node SO to have a predetermined voltage.

Figure 6:
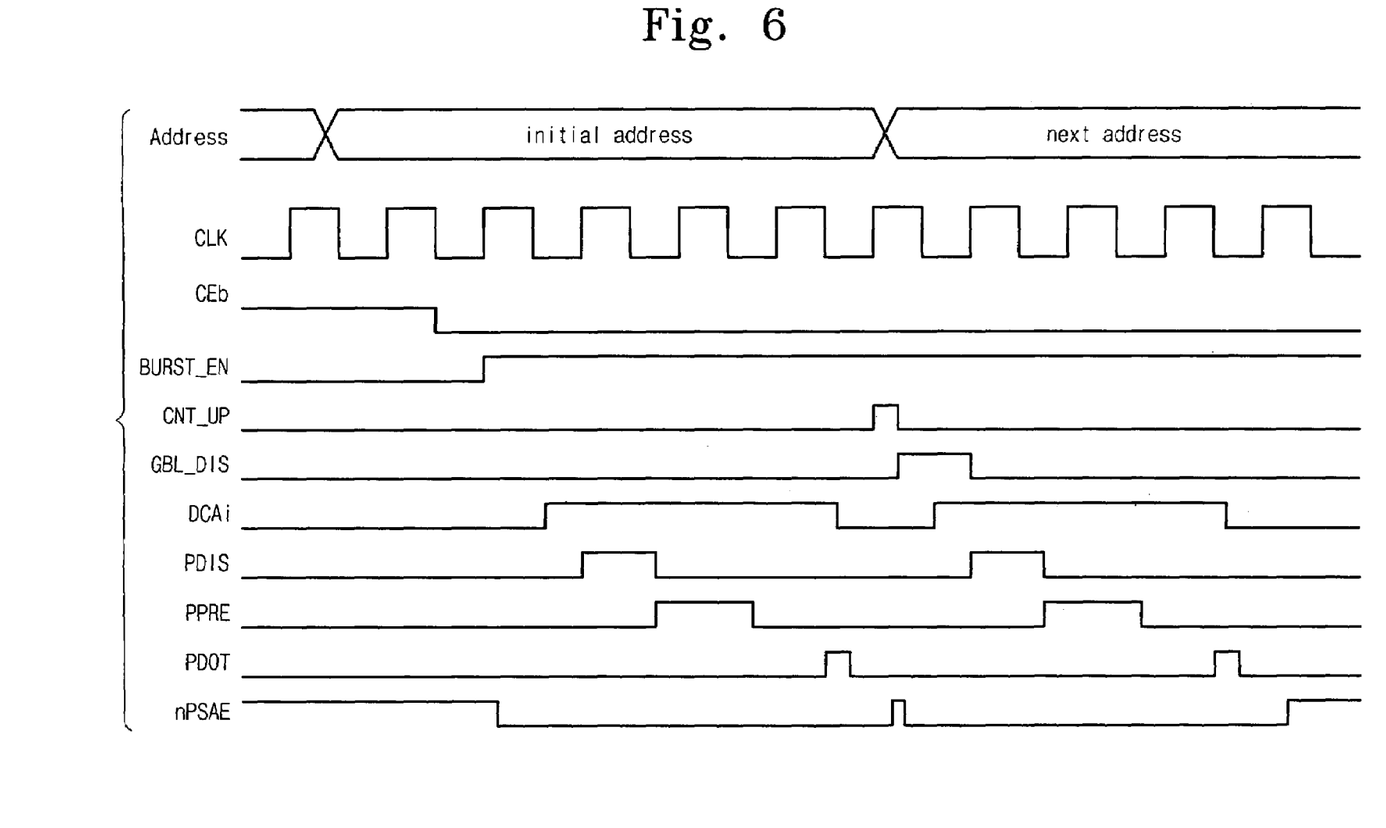
FIG. 6 is an example timing diagram for describing a burst read operation of a flash memory device according to embodiments of the present invention.

FIG. 6 is an example timing diagram illustrating a burst read operation of a flash memory device according to embodiments of the present invention. The burst read operation of the described flash memory device will be explained in detail with reference to the drawings herein. It is assumed for a convenience that a sector 110a is selected when a burst read operation is carried out according to an input of an initial address. If a chip enable signal CEb transitions from a high level to a low level, a burst enable signal circuit 180 activates a burst enable signal Burst_EN high in synchronization with a clock signal CLK. A burst read control circuit 190 operates in response to the activation of the burst enable signal Burst_EN. An externally provided initial address is loaded onto an address generator circuit 200 and the loaded address is transmitted to decoder circuits 140 and 160. The decoder circuit 140 decodes an input address to generate selection signals YAsel0–YAsel3 and YBsela–YBselc. At the same time, the decoder circuit 160 decodes an input address to generate selection signals Ycsel0i–Ycsel3i.

A first column gate circuit 120a corresponding to the selected sector 110a selects a part of the local bit lines BL0–BLm in response to the selection signals YAsel0–YAsel3, and the selected local bit lines are connected to corresponding global bit lines GBL0–GBLn through a sector selection circuit 130a, respectively. A second column gate block 150 selectively connects the global bit lines to a sense amplification block 170 in response to the selection signals Ycsel0i–Ycsel3i. A sense amplification control circuit 210 generates control signals PDIS, PPRE, PDOT, PLOAD and nPSAE for a sense amplifier in response to a transition of an address from the address generator circuit 200. An operation of a sense amplifier when the control signals PDIS, PPRE, PDOT, PLOAD and NPSAE are generated is identical to that above described and a control signal PDIS of a sense amplifier SA0 is activated, referring to FIGS. 5 and 7, a global bit line GBL0 connected to a sense amplifier SA0 is discharged through NMOS transistors M29 and M30 of sense amplifier SA0. At this time, since a discharge signal GBL_DIS is at a low level, an NMOS transistor M14 composing a discharge circuit 220 is turned off. That is, voltages of some global bit lines are discharged through the sense amplification block 170 during a burst read operation which is performed according to an input of an initial address.

Figure 7:
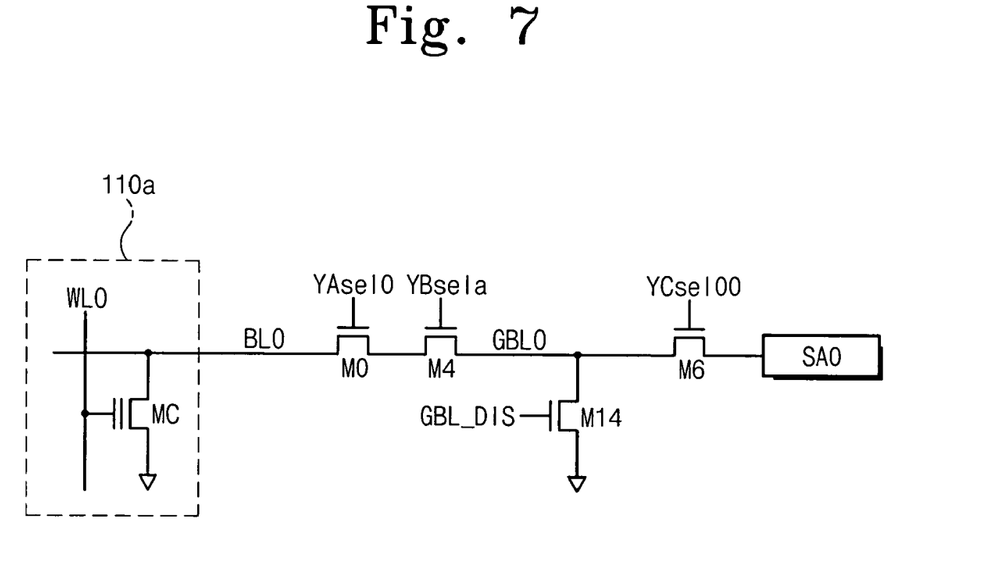
FIG. 7 is a circuit diagram illustrating a circuit construction corresponding to one global bit line during a burst read operation according to embodiments of the present invention.

When a sense operation is completed with respect to an initial address, a burst read control circuit 190 generates a count-up pulse signal CNT_UP in synchronization with a clock signal CLK so as to generate an address for a next burst read operation. As the count-up pulse signal CNT_UP becomes activated, a signal generator 221 of a discharge circuit 220 (FIG. 4) generates a discharge signal GBL_DIS, such that NMOS transistors M14–M16 are turned on. This means that voltages of the global bit lines GBL0-GBLn are discharged. At the same time, the address generator circuit 200 generates addresses for a next burst read operation in response to an activation of the count-up pulse signal CNT_UP. The generated address is transferred to the decoder circuits 140 and 160, and a sense amplification control circuit 210 generates control signals of the sense amplifier in response to an address transition from the address generator circuit 200. An operation of selecting local bit lines and global bit lines of the selected sector are performed in the same way as what is explained above, and description thereof is thus omitted. An operation of a sense amplifier when control signals are generated is identical to what is above described, and description thereof is thus omitted In other words, as illustrated in FIG. 7, the NMOS transistor M14 is turned as the discharge signal GBL_DIS becomes activated, such that the voltage of the global bit line GBL0 is discharged. At this time, the NMOS transistors M0, M4 and M6 selected according to results of decoding the address maintain a turned-off state. As a result, before the addresses are decoded, the voltages of the global bit lines GBL0–GBLn are discharged first by the discharge circuit 220. Because the global bit lines occupy most column loading, their discharge time can be shortened. Thus, a read speed/time of the inventive flash memory device can be improved when a set of burst read operations are carried out.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A semiconductor memory device comprising:
   a plurality of first bit lines;
   a plurality of second bit lines;
   a signal generator circuit structured to produce a flag signal notifying a burst read operation;
   an address generator circuit structured to provide an address in response to the flag signal;
   a column selection circuit structured to select a part of the plurality of first bit lines in response to the addresses, and connect the first bit lines to the plurality of second bit lines, respectively; and
   a discharge circuit for discharging voltages from the plurality of second bit lines in response to the flag signal;
   wherein the signal generator circuit is structured to produce the flag signal notifying a next burst read operation after an input of an initial address.

2. The memory device of claim 1, wherein the signal generator circuit is structured to produce the flag signal synchronized to a clock signal.

3. The memory device of claim 1, wherein the semiconductor memory device is a NOR type flash memory device.

4. A semiconductor memory device comprising:
   a plurality of first bit lines;
   a plurality of second bit lines;
   a signal generator circuit structured to produce a flag signal notifying a burst read operation;
   an address generator circuit structured to provide an address in response to the flag signal;

a column selection circuit structured to select a part of the plurality of first bit lines in response to the addresses, and connect the first bit lines to the plurality of second bit lines, respectively; and a discharge circuit for discharging voltages from the plurality of second bit lines in response to the flag signal;

wherein the discharge circuit comprises:

a discharge signal generator structured to produce a discharge signal in response to the flag signal; and a plurality of NMOS transistors respectively connected between the plurality of second bit lines and a ground voltage and controlled by the discharge signal.

5. A semiconductor memory device comprising:

a plurality of first bit lines;

a plurality of second bit lines;

a signal generator circuit structured to produce a flag signal notifying a burst read operation;

an address generator circuit structured to provide an address in response to the flag signal;

a column selection circuit structured to select a part of the plurality of first bit lines in response to the addresses, and connect the first bit lines to the plurality of second bit lines, respectively; and a discharge circuit for discharging voltages from the plurality of second bit lines in response to the flag signal;

wherein the second bit lines are structured to be discharged before the selecting operation of the column selection circuit.

6. A semiconductor memory device, comprising:

a plurality of first bit lines, each of which is coupled with a plurality of memory cells;

a plurality of second bit lines;

a signal generator circuit for generating a flag signal indicating a burst read operation in response to a clock signal and a chip enable signal;

an address generator circuit for generating addresses in response to the flag signal;

a first column selection circuit for selecting a part of the plurality of first bit lines in response to a first address of the address, the selected first bit lines thus being connected to the plurality of second bit lines respectively;

a discharge circuit for discharging the plurality of second bit lines in response to the flag signal;

a second column selection circuit for selecting a part of the plurality of second bit lines in response to a second address of the address;

a sense amplification control circuit for generating sense amplification control signals in response to a transition of the address; and a sense amplification circuit for sensing and amplifying voltages of the selected second bit lines in response to the sense amplification control signals during the burst read operation.

7. The memory device of claim 6, wherein the signal generator circuit generates the flag signal indicating a burst read operation after an input of an initial address.

8. The memory device of claim 6, wherein the semiconductor memory device is a NOR type flash memory device.

9. The memory device of claim 6, wherein the discharge circuit comprises:

a discharge signal generator for generating a discharge signal in response to the flag signal; and a plurality of NMOS transistors respectively connected between the second bit lines and a ground voltage and controlled by the discharge signal.

10. The memory device of claim 6, wherein the second bit lines are discharged before the selecting operation of the column selection circuit.

11. A non-volatile semiconductor memory device, comprising:

a plurality of sectors each including a plurality of local bit lines;

a burst enable circuit for generating a burst enable signal in response to a chip enable signal and a clock signal;

a burst read control circuit being operable in synchronization with the clock signal, and for generating a count-up pulse signal in response to the burst enable signal;

an address generator circuit for generating an address in response to the count-up pulse signal;

a first column selection circuit for selecting one of the plurality of sectors in response to a first address of the address and selecting a part of local bit lines of the selected sector;

a plurality of global bit lines respectively connected to local bit lines selected by the first column selection circuit; and a discharge circuit for discharging voltages of the plurality of second bit lines in response to the flag signal.

12. The non-volatile memory device of claim 11, further comprising:

a second column selection circuit for selecting a part of the global bit lines in response to a second address of the address;

a sense amplification control circuit for generating sense amplification control signals in response to a transition of the address; and a sense amplification circuit for sensing and amplifying voltages of the selected global bit lines in response to the sense amplification control signals.

13. The non-volatile memory device of claim 11, wherein the burst read control circuit generates the count-up pulse signal in response to the burst enable signal to enable a burst read operation after an input of an initial address.

14. The non-volatile memory device of claim 11, wherein the non-volatile memory device is a NOR-type flash memory device.

15. The non-volatile memory device of claim 11, wherein the discharge circuit comprises:

a discharge signal generator for generating a discharge signal in response to the count-up pulse signal; and a plurality of NMOS transistors respectively connected between the global bit lines and a ground voltage and controlled by the discharge signal.

16. The non-volatile memory device of claim 12, wherein the global bit lines are discharged before the selecting operations of the first and second column selection circuits.

17. A method of operating a non-volatile memory device including a sector having a plurality of a local bit lines and a plurality of global bit lines connected to a part of the plurality of local bit lines, comprising:

activating a count-up pulse signal synchronized with a clock signal during a burst read operation;

generating an address in response to the activation of the count-up pulse signal;

discharging the global bit lines in response to the activation of the count-up pulse signal; and after the global bit lines are discharged, selecting the local bit lines and the global bit lines in response to the address.

18. A method of reading cells in a non-volatile memory device, comprising:

generating a count-up pulse signal;

discharging one or more bit lines in the memory device after receiving the count-up pulse signal;

generating a new address after receiving the count-up pulse signal;

decoding the new address to determine which memory cells of the memory device to read; and sensing the cells located at the new address using the previously discharged one or more bit lines.

19. The method of claim 18 wherein discharging one or more bit lines comprises discharging one or more global bit lines.

20. The method of claim 18, further comprising generating a global discharge signal after receiving the count-up pulse signal.

21. The method of claim 20, further comprising applying the global discharge signal to a control terminal of one or more switches respectively coupled between the one or more bit lines and a reference voltage.

* * * * *